(12) United States Patent
Morinaga et al.

(10) Patent No.: US 8,486,832 B2
(45) Date of Patent: Jul. 16, 2013

(54) METHOD FOR FABRICATING SEMICONDUCTOR DEVICE

(75) Inventors: Yasunori Morinaga, Osaka (JP); Hideo Nakagawa, Shiga (JP)

(73) Assignee: Panasonic Corporation, Osaka (JP)

( * ) Notice: Subject to any disclaimer, the term of this patent is extended or adjusted under 35 U.S.C. 154(b) by 1340 days.

(21) Appl. No.: 11/898,140

(22) Filed: Sep. 10, 2007

(65) Prior Publication Data

US 2008/0188076 A1     Aug. 7, 2008

(30) Foreign Application Priority Data

Feb. 1, 2007   (JP) ................................. 2007-022896

(51) Int. Cl.
  *H01L 21/44*  (2006.01)
(52) U.S. Cl.
  USPC ................... 438/675; 438/672; 257/E21.584; 257/E21.585; 257/E21.586
(58) Field of Classification Search
  USPC .. 438/653, 672, 674, 675, 687; 257/E21.584, 257/E21.585, E21.586, E21.169, E21.175; 205/118, 123
  See application file for complete search history.

(56) References Cited

U.S. PATENT DOCUMENTS

| 5,786,259 | A  | * | 7/1998 | Kang ............................. 438/396 |
| 7,002,201 | B2 | * | 2/2006 | Yasuda ......................... 257/306 |
| 7,495,309 | B2 | * | 2/2009 | Sato et al. ..................... 257/529 |
| 2003/0003303 | A1 | | 1/2003 | Ohtsu et al. |
| 2004/0183201 | A1 | | 9/2004 | Shimada et al. |
| 2007/0057305 | A1 | * | 3/2007 | Oates et al. ................... 257/301 |

FOREIGN PATENT DOCUMENTS

| JP | 5-267643   | 10/1993 |
| JP | 2002-75995 | 3/2002 |
| JP | 2003-16857 | 1/2003 |
| JP | 2004-14626 | 1/2004 |
| JP | 2004-221494| 8/2004 |

* cited by examiner

*Primary Examiner* — David Vu

(74) *Attorney, Agent, or Firm* — McDermott Will & Emery LLP

(57) ABSTRACT

A trench is formed in an interlayer dielectric formed on a substrate, then a barrier seed film is formed to cover the interlayer dielectric and the inner walls of the trench, and copper is embedded in the trench by electrolytic plating using the barrier seed film as an electrode. The barrier seed film is a single-layer film made of an oxide or nitride of a refractory metal and contains a low-resistance metal other than copper.

5 Claims, 2 Drawing Sheets

METHOD FOR FABRICATING SEMICONDUCTOR DEVICE

BACKGROUND OF THE INVENTION (1) Field of the Invention

The present invention relates to methods for fabricating a semiconductor device in which copper is used for interconnects or plugs.

(2) Description of Related Art

With a recent CMOS miniaturization, the interconnect resistance has been increasing markedly due to miniaturization of interconnects. An increase in the interconnect delay time due to an increase in the interconnect resistance leads to degradation in the LSI performance. For this reason, the need for reducing the interconnect resistance has become imperative. The interconnect resistance can be sharply reduced by changing the interconnect material from Al to Cu. However, there are many Cu-specific problems to be solved (for example, diffusion of Cu, the adhesion of Cu to an insulating film, and a technique for forming a Cu film), and reliable Cu interconnects or plugs cannot be easily achieved.

FIGS. 2A through 2D are cross-sectional views illustrating process steps in a known method for forming a Cu interconnect. As illustrated in FIG. 2A, a trench 110 is formed in an interlayer dielectric 101 formed on a substrate (or an insulating film) 100, and a barrier film 102 made of, for example, a TiN film is formed to cover the interlayer dielectric 101 and the inner walls of the trench 110. This barrier film 102 serves to prevent diffusion of Cu and improve the adhesion of Cu. In order to improve the adhesion of the barrier film 102, the barrier film 102 is subjected to plasma treatment for improving the quality of the barrier film 102.

Next, as illustrated in FIG. 2B, a Cu seed film 103 is formed, for example, by a PVD (physical vapor deposition) method to cover the barrier film 102, and then, as illustrated in FIG. 2C, an interconnect material, Cu 104, is embedded in the trench 110 by electrolytic plating using the Cu seed film 103 as an electrode. Subsequently, the embedded Cu 104 is annealed, and then, as illustrated in FIG. 2D, part of the Cu 104 formed on the interlayer dielectric 101 is planarized, for example, by a CMP (chemical mechanical polishing) method. In this manner, an interconnect or plug is configured by embedding the Cu 104 in the trench 110.

Meanwhile, in the known method, the width and aspect ratio of the trench 110 and other factors may cause the trench 110 to be insufficiently filled with Cu 104, leading to generation of voids. The reason for this is considered as follows. For example, when the degree to which a region of the barrier film 102 located on the sidewall of the trench 110 is modified by plasma treatment is insufficient, Cu atoms agglomerate on the region thereof which is located on the sidewall of the trench 110 and on which a thinner part of the Cu seed film 103 is formed by PVD. This reduces the amount of Cu electrodeposited on the region of the barrier film 102 located on the sidewall of the trench 110 by electrolytic plating of Cu, leading to generation of voids.

A method in which use of Cu doped with Al (for example, a Cu—Al alloy) as a material of a seed film 103 restrains voids from being generated due to the agglomeration of Cu atoms is disclosed in a patent document (Japanese Unexamined Patent Application Publication No. 2004-14626). It has been considered that the above-described method can be explained as follows. Al contained in the seed film 103 reacts with Ti in a barrier film 102 made of TiN, thereby producing a compound of $Al_3Ti$. Consequently, the state of the seed film 103 bound with the barrier film 102 and thus the state of the surface of the seed film 103 are changed, resulting in a reduction of the agglomerated Cu atoms.

SUMMARY OF THE INVENTION

The seed film 103 made of Cu doped with Al, which is disclosed in the above patent document, is excellent in that it can restrain voids from being generated in the Cu embedded in the trench 110 and thus improve its reliability. However, since not only Cu but also the barrier film 102 and the seed film 103 become parts of an interconnect or plug, the respective resistances of the barrier film 102 and the seed film 103 relative to the resistance of the whole interconnect or plug cannot be ignored.

Meanwhile, when an attempt is made to reduce the respective thicknesses of the barrier film 102 and the seed film 103 in order to reduce the respective resistances thereof, this causes reduction in the reliability of the interconnect or plug, such as reduction in the adhesion of the barrier film 102. Furthermore, since Al is contained in the seed film 103, Al is deposited at a Cu grain boundary in the vicinity of the boundary between the seed film 103 and the Cu 104 in a heat treatment process step after the filling of the trench 110 with the Cu 104, resulting in the increased interconnect resistance.

The present invention is made in view of the above problems, and its main object is to provide a semiconductor device including a low-resistance and high-reliability Cu interconnect or plug.

In order to solve the above problems, the present inventors considered that, if a single-layer film combining the respective functions of the barrier film and the seed film (hereinafter, referred to as a "barrier seed film") could be used for the Cu interconnect or plug, the resistance of the Cu interconnect or plug could be reduced without loss of reliability.

To cope with this, the present inventors focused attention on an oxide or nitride of a refractory metal exhibiting excellent adhesion to an insulating film and having a small Cu diffusion coefficient. Although such an oxide or nitride is usually an insulative material or a semi-insulating material (or a semiconductive material), the present inventors considered that, if such a material were rendered conductive by being doped with a low-resistance metal, such as Al, this could provide a single-layer barrier seed film having not only the function of a barrier film but also the function of a seed film, and thus conceived the present invention.

More particularly, a method for fabricating a semiconductor device of the present invention includes the steps of: forming a trench in an interlayer dielectric formed on a substrate; forming a barrier seed film to cover the interlayer dielectric and inner walls of the trench; and embedding copper in the trench by electrolytic plating using the barrier seed film as an electrode, wherein the barrier seed film is a single-layer film made of an oxide or nitride of a refractory metal and contains a low-resistance metal other than copper.

According to this method, a thin barrier seed film can be formed by allowing the single-layer film made of the oxide or nitride of the refractory metal containing the low-resistance metal to have both the functions of a barrier film and a seed film. This can achieve a low-resistance Cu interconnect or plug. Furthermore, since a barrier seed film made of such a material exhibits excellent adhesion, this can achieve a high-reliability Cu interconnect or plug.

The oxide or nitride of the refractory metal is preferably made of a group II-VI compound. The group II-VI compound not only forms a covalent bond but also possesses ion-binding properties. This can increase the solubility limit of the low-resistance metal. As a result, the resistance of the barrier seed film can be further reduced.

DETAILED DESCRIPTION OF THE INVENTION

Figure 1A:
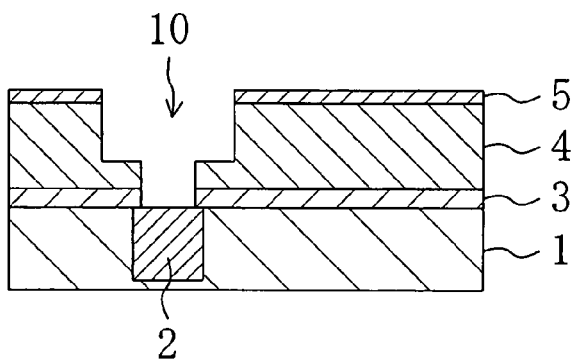
FIGS. 1A through 1D are cross-sectional views illustrating process steps in a fabrication method for a semiconductor device according to a first embodiment of the present invention.

Embodiments of the present invention will be described hereinafter with reference to the drawings. It should be noted that, in the following drawings, for simplicity, components having substantially the same functions are denoted by the same reference numerals. The present invention is not limited to the following embodiments.

Embodiment 1

FIGS. 1A through 1D are cross-sectional views schematically illustrating process steps in a fabrication method for a semiconductor device including a Cu interconnect or plug according to a first embodiment of the present invention. In this embodiment, a dual damascene interconnect will be described as an example. However, the method of the present invention can be applied also to the other interconnect or plug structures.

First, as illustrated in FIG. 1A, a liner film (for example, a SiC film) 3, a low-permittivity interlayer dielectric (for example, a SiOC film) 4, and a hydrophilic oxide film (for example, a TEOS film) 5 are sequentially formed on an insulating film (for example, a SiO$_2$ film) 1 in the top surface of which a conductive material 2 is embedded. A trench 10 for an interconnect or plug is formed in the interlayer dielectric 4 by using an etching technique for a normal dual damascene interconnect.

Figure 1B:
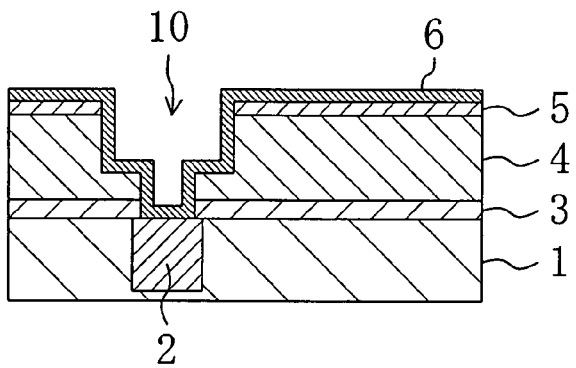

Next, as illustrated in FIG. 1B, a barrier seed film 6 is formed to cover the interlayer dielectric 4 and the inner walls of the trench 10. The barrier seed film 6 is a single-layer film made of an oxide or nitride of a refractory metal, and a material containing a low-resistance metal other than copper is used as a material of the film 6. Although, for example, Zn, Ti, Zr, Hf, Nb, Ta, W, V, Mo, Mn, Ru, Os, Co, Rh, Ir, or any other metal can be used as the refractory metal, and, for example, Al, Ag, Au, or any other metal can be used as the low-resistance metal, this is not restrictive.

For example, TiO$_2$, ZrO$_2$, HfO$_2$, Nb$_2$O$_3$, TaO$_2$, WO$_2$, V$_2$O$_3$, MoO$_2$, MnO$_2$, RuO$_2$, OsO$_2$, CoO$_2$, RhO$_2$, IrO$_2$, or any other oxide can be used as the oxide of the refractory metal. Furthermore, for example, ZrN$_x$, HfN$_x$, NbN$_x$, WN$_x$, VN$_x$, MoN$_x$, MnN$_x$, RuN$_x$, OsN$_x$, CoN$_x$, RhN$_x$, IrN$_x$, or any other nitride (0<x<1) can be used as the nitride of the refractory metal. A nitride of a refractory metal is preferably used for the barrier seed film 6. The reason for this is as follows. When a nitride of a refractory metal is used, the influence of modification of the interlayer dielectric 4 due to oxidation of a part of the interlayer dielectric 4 in the vicinity of the interface thereof is reduced as compared with when an oxide of a refractory metal is used. This reduction can restrain an increase in the dielectric constant of the interlayer dielectric 4 due to damage to the interlayer dielectric 4. Meanwhile, in order to reduce the resistance of the barrier seed film 6, the refractory metal may be a combination of two or more elements or a mixture of an oxide and a nitride.

A ZnO film containing Al can be used as a preferred example of the barrier seed film 6. ZnO representing a group II-VI compound does not only form a covalent bond but also possesses ion-binding properties. This can increase the solubility limit of Al. As a result, the resistance of the barrier seed film 6 can be further reduced. In order to achieve the function of a seed film, the content of Al in the ZrO film preferably falls within the range of 0.1 at % through 25 at %. Use of any other group II-VI compound instead of ZnO can also provide the same effect.

Furthermore, for example, a PVD method, an ALD (atomic layer deposition) method, a CVD (chemical vapor deposition) method, or any other method can be used to form a barrier seed film 6. The barrier seed film 6 preferably has a thickness of, for example, approximately 2 through 15 nm.

Figure 1C:
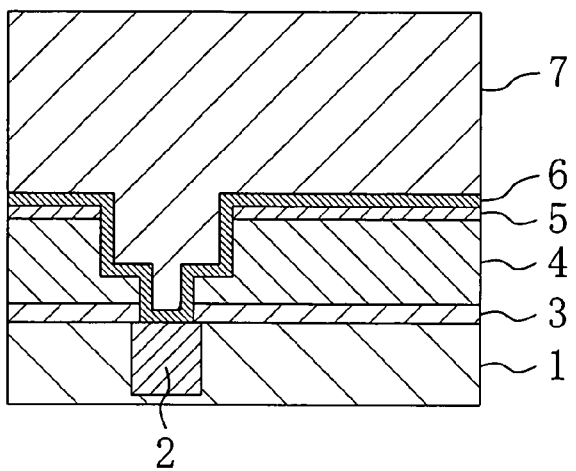

Next, as illustrated in FIG. 1C, copper (Cu) 7 is embedded in the trench 10 by electrolytic plating using the barrier seed film 6 as an electrode. In this case, the thickness of a flat region of the Cu 7 located on the interlayer dielectric 4 is approximately 600 nm.

Figure 1D:
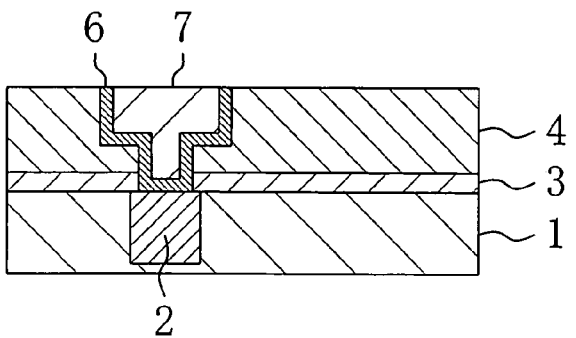
Figure 2A:
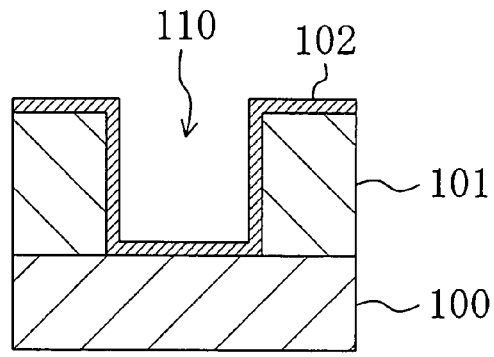
FIGS. 2A through 2D are cross-sectional views illustrating a known fabrication method for an embedded Cu interconnect.
Figure 2B:
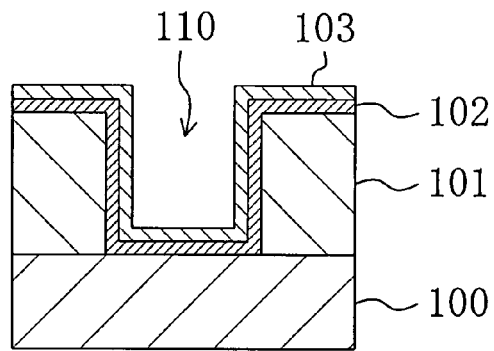
Figure 2C:
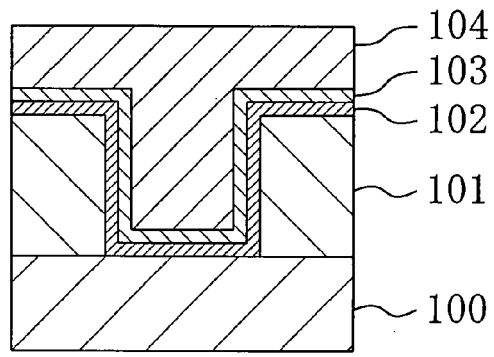
Figure 2D:
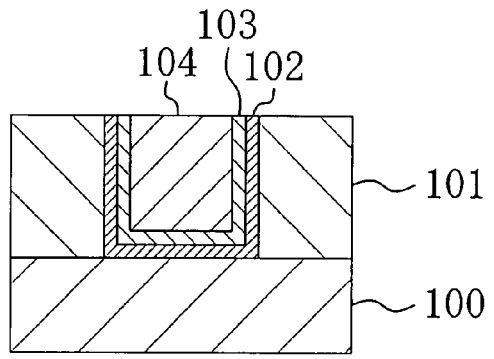

Thereafter, the Cu 7 is annealed at 400° C. for approximately 30 minutes so as to be modified, and then, as illustrated in FIG. 1D, the region of the Cu 7 located on the interlayer dielectric 4 is planarized by CMP, thereby forming a dual damascene interconnect configured by embedding the Cu 7 in the trench 10.

In this embodiment, an oxide or nitride of a refractory metal is rendered conductive by being allowed to contain a low-resistance metal, thereby forming a barrier seed film 6 having not only barrier properties against the Cu 7 but also the function of a seed film. Thus, use of a single-layer barrier seed film 6 exhibiting excellent adhesion to the interlayer dielectric 4 can achieve a low-resistance and high-reliability Cu interconnect or plug.

Modification of Embodiment 1

Since the barrier seed film 6 of the present invention contains a low-resistance metal, such as Al, the low-resistance metal, such as Al, may diffuse into the Cu 7 and segregate thereto in the annealing process step after the filling of the trench 10 with the Cu 7. As a result, the resistance of the Cu interconnect or plug may increase.

Typically, the grain size of the Cu 7 embedded in the trench 10 by electrolytic plating is small in the vicinity of the inner walls of the trench 10 but large inside the trench 10. The low-resistance metal, such as Al, diffused into the Cu 7 is deposited at the crystalline interface of the Cu 7. Meanwhile, it has been known that, with an increase in the grain size of Cu, the degree of increase in the resistance of Cu becomes smaller.

To cope with the above problem, the low-resistance metal contained in the barrier seed film 6 of the present invention is distributed such that the concentration of the low-resistance metal in the vicinity of the interface surface of the barrier seed film 6 in contact with the Cu 7 embedded in the trench 10 becomes high. Thus, the low-resistance metal thermally diffused into the Cu 7 can be further diffused into the inside of the trench 10 according to the Fick's first law representing that the diffusion distance of a material depends on the concentration thereof. This can effectively restrain the resistance of the Cu interconnect or plug from increasing.

The barrier seed film 6 in which the concentration of the low-resistance metal is distributed as described above can be formed by controlling the amount of the low-resistance metal to be supplied to the oxide or nitride of the refractory metal, for example, using an ALD method, an MBE (molecular beam epitaxy) method, a sputtering method, or any other method.

Embodiment 2

The barrier seed film 6 of the first embodiment is made of an oxide or nitride of a refractory metal containing a low-resistance metal, such as Al. In this case, even when a group II-VI compound is used as the oxide or nitride of the refractory metal, the solubility limit of the low-resistance metal is approximately 30 at %.

In this embodiment, an alloy containing a low-resistance metal is used as the barrier seed film 6. This can further increase the content of the low-resistance metal in the barrier seed film 6, allows the low-resistance metal thermally diffused into the Cu 7 to be further diffused into the inside of the trench 10 according to the Fick's first law, and can further restrain the resistance of the Cu interconnect or plug from increasing.

Furthermore, a regular structure of the alloy ensures the path through which the low-resistance metal diffuses into the alloy. This eliminates the need for establishing a concentration gradient of the low-resistance metal in the barrier seed film 6. However, the barrier seed film 6 made of the alloy containing the low-resistance metal exhibits low adhesion to an interlayer dielectric. Therefore, an adhesion layer, such as a TiN film, may be formed between an interlayer dielectric 4 and the barrier seed film 6.

For example, $TiAl_2$ can be used as a preferred example of the alloy containing the low-resistance metal. Furthermore, for example, Al, Ag, Au, or any other metal can be used as the low-resistance metal. However, this is not restrictive.

When the alloy containing the low-resistance metal is allowed to contain Cu, the interdiffusion of Cu can be balanced between the barrier seed film 6 and the Cu interconnect or plug. This can further improve the barrier properties of the barrier seed film 6. For example, $CuAlSi_2$ or any other alloy can be used as a preferred example of such a barrier seed film 6.

Although the present invention was described above with reference to the preferred embodiments, the above description is not limited and can be certainly modified in various ways.

What is claimed is:

1. A method for fabricating a semiconductor device, the method comprising steps of:
    forming a trench in an interlayer dielectric formed on a substrate;
    forming a barrier seed film to cover the interlayer dielectric and inner walls of the trench; and
    embedding copper in the trench by forming the copper directly on a surface of the barrier seed film by electrolytic plating using the barrier seed film as an electrode, wherein:
    the barrier seed film is a single-layer film made of an oxide of at least one metal of Zn, Ti, Zr, Hf, Nd, Ta, W, V, Mo, Mn, Ru, Os, Co, Rh and Ir, and contains a low-resistance metal other than copper as a dopant to provide conductivity to the barrier seed film,
    the step of forming the barrier seed film includes a step of doping the low-resistance metal in the barrier seed film so that a concentration of the low-resistance metal in the vicinity of an interface of the barrier seed film in contact with the copper embedded in the trench is higher than a concentration of the low-resistance metal in the vicinity of an interface of the barrier seed film in contact with the interlayer dielectric, and
    the low-resistance metal is any one of Al, Ag and Au.

2. The method of claim 1, wherein
an amount of the low-resistance metal doped in the oxide is within the range of 0.1 at % through 25 at %.

3. The method of claim 1, wherein
the oxide of the metal is ZnO, and the low-resistance metal is Al.

4. The method of claim 1, wherein
the copper embedded in the trench forms a via or interconnect.

5. The method of claim 1, wherein the barrier seed metal is formed by using an ALE method, an MBE method or an sputtering method with controlling of a supply amount of the low-resistance metal.

* * * * *